(12) United States Patent
Huang et al.

(10) Patent No.: US 9,129,948 B2
(45) Date of Patent: Sep. 8, 2015

(54) SEMICONDUCTOR DEVICE AND METHOD OF ASSEMBLING SAME

(71) Applicant: Freescale Semiconductor, Inc., Austin, TX (US)

(72) Inventors: Meiquan Huang, Tianjin (CN); Huan Wang, Tianjin (CN); Jinsheng Wang, Tianjin (CN); Naikou Zhou, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/499,240

(22) Filed: Sep. 29, 2014

(65) Prior Publication Data

US 2015/0011053 A1 Jan. 8, 2015

Related U.S. Application Data

(62) Division of application No. 13/854,137, filed on Apr. 1, 2013, now Pat. No. 8,878,348.

(30) Foreign Application Priority Data

Sep. 11, 2012 (CN) .......................... 2012 1 0334279

(51) Int. Cl.
*H01L 21/00* (2006.01)
*H01L 23/495* (2006.01)
(Continued)

(52) U.S. Cl.
CPC .......... *H01L 23/49503* (2013.01); *H01L 21/56* (2013.01); *H01L 21/561* (2013.01); *H01L 23/3128* (2013.01); *H01L 23/4952* (2013.01); *H01L 23/49506* (2013.01); *H01L 24/49* (2013.01); *H01L 24/81* (2013.01); *H01L 24/83* (2013.01); *H01L 24/97* (2013.01); *H01L 23/3677* (2013.01); *H01L 23/49541* (2013.01); *H01L 24/29* (2013.01); *H01L 24/32* (2013.01); *H01L 24/48* (2013.01); *H01L 24/85* (2013.01); *H01L 2224/2919* (2013.01);
(Continued)

(58) Field of Classification Search
CPC ... H01L 23/49503; H01L 21/56; H01L 24/83; H01L 2924/01079; H01L 2924/01046; H01L 24/49; H01L 24/97; H01L 2224/48091; H01L 2924/0014
USPC ......... 438/106, 109, 113, 121, 123, 125, 127, 438/613; 257/666, 676, E23.031, E23.043
See application file for complete search history.

(56) References Cited

U.S. PATENT DOCUMENTS 5,731,231 A * 3/1998 Miyajima ..................... 438/124
6,027,590 A 2/2000 Sylvester
(Continued)

*Primary Examiner* — Yosef Gebreyesus
(74) *Attorney, Agent, or Firm* — Charles Bergere

(57) ABSTRACT

A semiconductor device has a die support and external leads formed integrally from a single sheet of electrically conductive material. A die mounting substrate is mounted on the die support, with bonding pads coupled to respective external connection pads on an external connector side of the substrate. A die is attached to the die mounting substrate with die connection pads. Bond wires selectively electrically couple the die connection pads to the external leads and the bonding pads and electrically conductive external protrusions are mounted to the external connection pads. An encapsulant covers the die and bond wires. The external protrusions are located at a central region of a surface mounting side of the package and the external leads project outwardly from locations near the die support towards peripheral edges of the package.

8 Claims, 10 Drawing Sheets

(51) Int. Cl.
*H01L 23/00* (2006.01)
*H01L 21/56* (2006.01)
*H01L 23/31* (2006.01)
*H01L 23/367* (2006.01)

(52) U.S. Cl.
CPC ............... *H01L 2224/32225* (2013.01); *H01L 2224/48091* (2013.01); *H01L 2224/48108* (2013.01); *H01L 2224/48227* (2013.01); *H01L 2224/48235* (2013.01); *H01L 2224/48247* (2013.01); *H01L 2224/49109* (2013.01); *H01L 2224/49171* (2013.01); *H01L 2224/49173* (2013.01); *H01L 2224/73265* (2013.01); *H01L 2224/8385* (2013.01); *H01L 2224/83851* (2013.01); *H01L 2224/85424* (2013.01); *H01L 2224/85444* (2013.01); *H01L 2224/85447* (2013.01); *H01L 2224/85464* (2013.01); *H01L 2224/92247* (2013.01); *H01L 2224/97* (2013.01); *H01L 2924/00014* (2013.01); *H01L 2924/01046* (2013.01); *H01L 2924/01079* (2013.01); *H01L 2924/15174* (2013.01); *H01L 2924/15184* (2013.01); *H01L 2924/3511* (2013.01)

(56) References Cited

U.S. PATENT DOCUMENTS

| | | | |
|---|---|---|---|
| 6,087,201 | A * | 7/2000 | Takahashi et al. ............ 438/106 |
| 6,229,227 | B1 * | 5/2001 | Muthukumaraswamy et al. ............... 307/38 |
| 6,387,731 | B1 | 5/2002 | Wensel |
| 6,611,063 | B1 * | 8/2003 | Ichinose et al. ............... 257/784 |
| 7,166,252 | B2 | 1/2007 | Gochnour |
| 7,172,927 | B2 | 2/2007 | Yuan |
| 2002/0089044 | A1 * | 7/2002 | Simmons et al. ............ 257/668 |
| 2006/0192295 | A1 * | 8/2006 | Lee et al. ..................... 257/778 |
| 2007/0001278 | A1 * | 1/2007 | Jeon et al. ..................... 257/676 |
| 2008/0217753 | A1 * | 9/2008 | Otani ............................ 257/690 |
| 2009/0087953 | A1 * | 4/2009 | Lin ................................ 438/123 |
| 2009/0283919 | A1 * | 11/2009 | Tsui et al. ..................... 257/778 |
| 2009/0321913 | A1 * | 12/2009 | Shim et al. ................... 257/690 |
| 2010/0029046 | A1 * | 2/2010 | Camacho et al. ............ 438/118 |
| 2010/0124802 | A1 * | 5/2010 | Chiang et al. ................ 438/124 |
| 2010/0302749 | A1 | 12/2010 | Kao |
| 2010/0320590 | A1 * | 12/2010 | Camacho et al. ............ 257/692 |
| 2011/0169150 | A1 * | 7/2011 | Su et al. ........................ 257/675 |
| 2012/0001306 | A1 * | 1/2012 | Wang et al. .................. 257/666 |
| 2012/0205790 | A1 * | 8/2012 | Haga ............................ 257/676 |
| 2013/0026609 | A1 | 1/2013 | Wu |

* cited by examiner

SEMICONDUCTOR DEVICE AND METHOD OF ASSEMBLING SAME

CROSS-REFERENCE TO RELATED APPLICATIONS

This application is a divisional application of U.S. patent application Ser. No. 13/854,137 filed on Apr. 1, 2013.

BACKGROUND OF THE INVENTION

The present invention relates to semiconductor packaging and, more particularly, to a packaged semiconductor device that has electrically conductive external protrusions in the form of a ball grid array or other similar array of external connectors.

There are numerous types of semiconductor packages. Such packages are typically formed with a semiconductor die mounted on a non-conductive substrate or lead frame. External connectors on either the substrate or leads of the lead frame are wire bonded to die connection pads on the die to provide a means of easily electrically connecting the die to circuit boards and the like. After the connectors and pads are wire bonded, the semiconductor die and connectors are encapsulated (packaged) in a compound such as a plastics material leaving external pads of the substrate or sections of the leads exposed. The external connectors or exposed leads provide external electrical connection of the die to a circuit board.

Semiconductor devices (packaged semiconductor die) are assembled (manufactured) with increasing numbers of external connectors (i.e., increasing pin or lead count). The electronics industry has attempted to increase the density of die contacts as the number of signal and power lines has increased by using wire bond lead connection techniques and ball grid array (BGA) connections. However, the wire bond lead connections are peripheral pads that are typically arranged on all sides of a packaged device. These leads are relatively large and thus increase the minimum obtainable size of the packaged device.

In contrast, a BGA device has a semiconductor die mounted or attached to a carrier substrate. Solder balls are affixed to a lower surface of the carrier substrate and the minimum obtainable size of the packaged device can be smaller than that of a wire bond lead connection type device. Although BGA devices provide a useful alternative to wire bond lead connection type devices, the carrier substrate is susceptible to warping during solder reflowing when the BGA device is being mounted to a Printed Circuit Board (PCB). This warping usually takes the form of an external PCB facing surface of the carrier substrate deforming from a planar surface into a slightly convex surface, which may cause poor soldered connections or open circuits. It would therefore be useful if the probability of BGA, or other grid array, carrier substrate warping could be reduced or at least alleviated.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
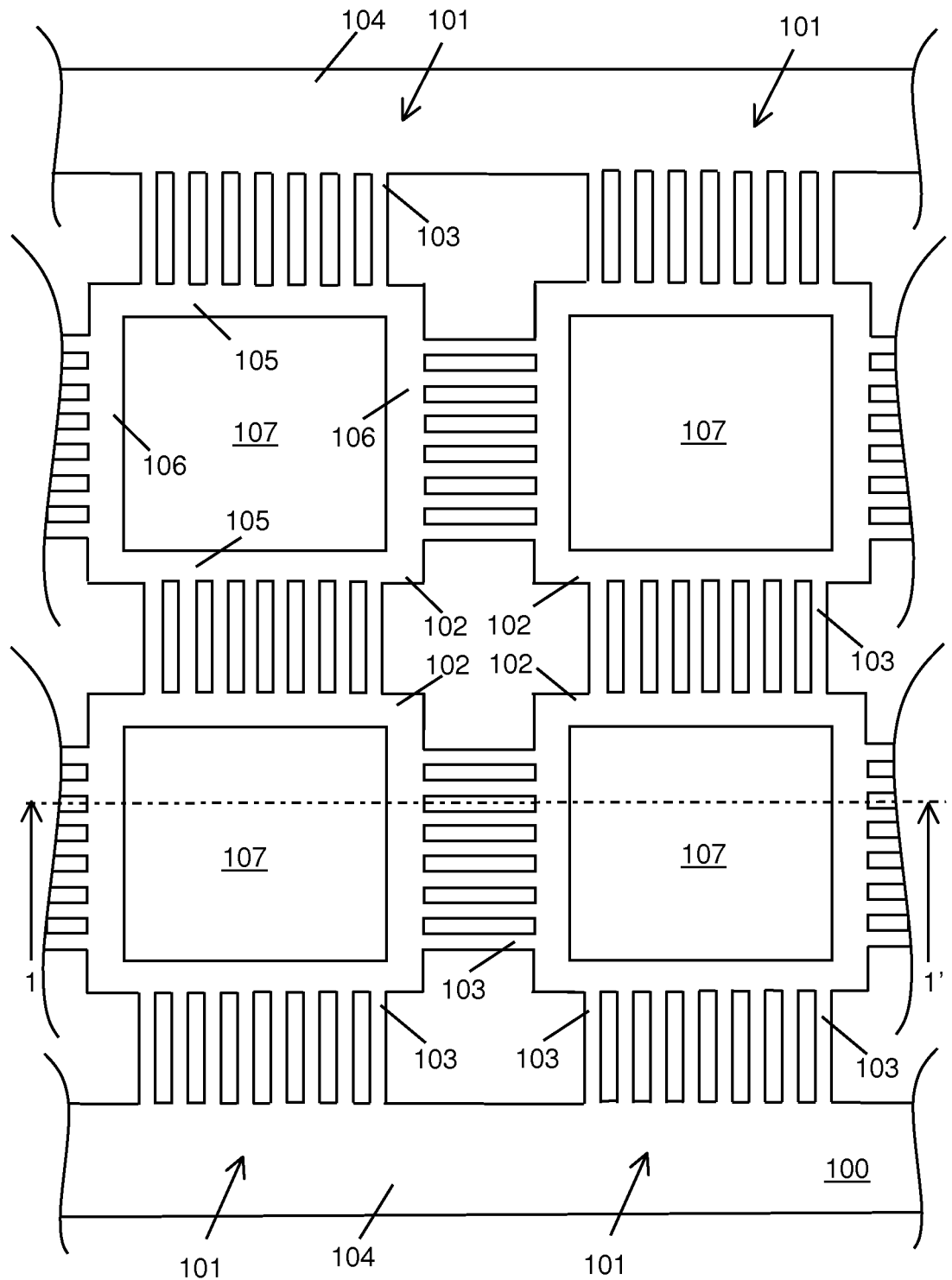
FIG. 1 is a top plan view of an electrically conductive lead frame sheet in accordance with an embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that system, circuit, device components and method steps that comprises a list of elements or steps does not include only those elements but may include other elements or steps not expressly listed or inherent to such system, circuit, device components or steps. An element or step proceeded by "comprises . . . a" does not, without more constraints, preclude the existence of additional identical elements or steps that comprises the element or step.

In one embodiment of the present invention there is provided a semiconductor device comprising a die support and external leads formed integrally from a single sheet of electrically conductive material. There is a die mounting substrate having a die mounting side and an opposite external connector side mounted on the die support, wherein the die mounting side has bonding pads coupled to respective external connection pads on the external connector side of the substrate. The device has a semiconductor die having a die support mounting surface attached to the die mounting side of the die mounting substrate, and an opposite die connection pad surface with associated die connection pads, where the die connection pads are circuit nodes of the semiconductor die. There are bond wires selectively electrically coupling the die connection pads to the external leads and the bonding pads and electrically conductive external protrusions are mounted to the external connection pads. An encapsulating material provides for at least partially encapsulating the die and bond wires, where the external protrusions are located at a central region of a surface mounting side of the package. The external leads project outwardly on the surface mounting side from locations proximal to the die support towards peripheral edges of the package.

In another embodiment of the present invention there is provided a method for packaging or assembling a semiconductor device. The method includes providing a die support and external leads formed integrally from a single sheet of electrically conductive material. The method also includes mounting a die mounting substrate on the die support, the die mounting substrate having a die mounting side and an opposite external connector side mounted on the die support wherein the die mounting side has bonding pads coupled to respective external connection pads on the external connector side of the substrate. There is also performed mounting of a semiconductor die to the die mounting substrate, the semiconductor die having a die support mounting surface attached to the die mounting side of the die mounting substrate, and an opposite die connection pad surface with associated die connection pads, where the die connection pads are circuit nodes of the semiconductor die. The method also includes selectively electrically coupling the die connection pads to the external leads and the bonding pads and mounting electrically conductive external protrusions to the external connection pads. Encapsulating is performed to cover at least part of the die with an encapsulant to form the semiconductor device, where the external protrusions are located at a central region of a surface mounting side of the package or device. The external leads project outwardly on the surface mounting side from locations proximal to the die support towards peripheral edges of the device.

Referring now to FIG. 1, a top plan view of an electrically conductive lead frame sheet 100 in accordance with a preferred embodiment of the present invention is shown. The lead frame sheet 100 has a plurality of lead frames 101, each comprising a die support 102 and a plurality of external leads 103 extending from the die support 102 to either another die support 102 or sheet boundary regions 104. The electrically conductive lead frame sheet 100 and therefore each die support 102 and external leads 103 are formed integrally from a single sheet of electrically conductive material such as copper, aluminum or similar metals or alloys thereof. As is known, the sheet 100 may be plated with other metals or metal alloys. In one embodiment, the sheet comprises copper plated with a solderable metal that is itself plated with a Noble metal such as Gold or Palladium. In this embodiment the die support 102 includes two sets of spaced parallel members 105, 106 that form a rectangular frame enclosing a central lead frame space 107.

Figure 2:
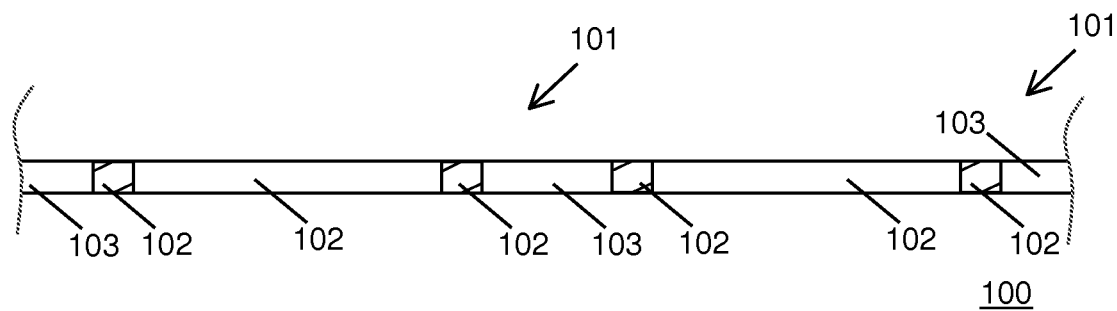
FIG. 2 is a cross-sectional side view of the electrically conductive lead frame sheet of FIG. 1, through 1-1', in accordance with an embodiment of the present invention.

FIG. 2 is a cross-sectional side view of the electrically conductive lead frame sheet 100, through 1-1', in accordance with a preferred embodiment of the present invention. As shown, the die support 102 and external leads 103 lie in the same plane.

Figure 3:
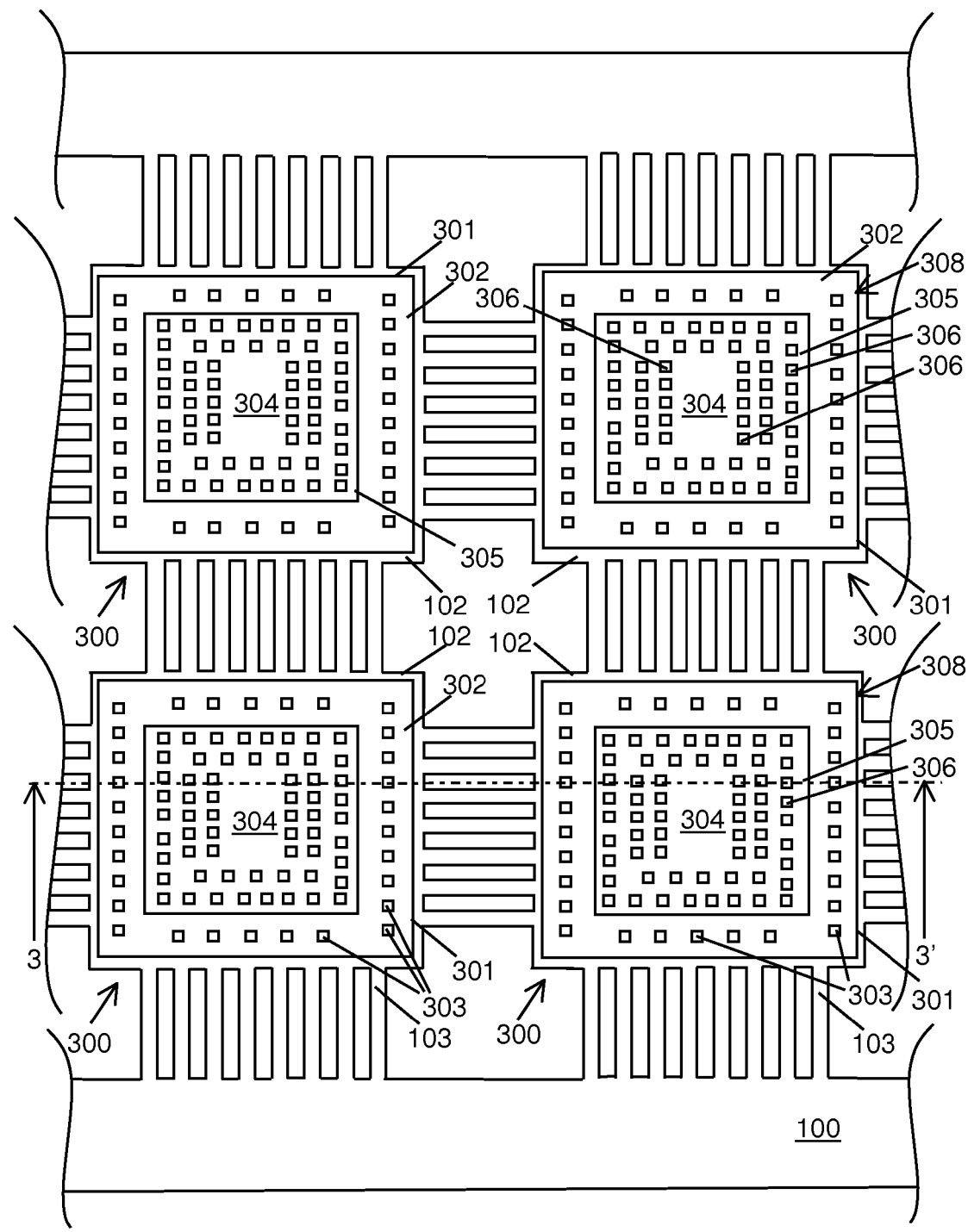
FIG. 3 is a top plan view of partially assembled devices formed on the electrically conductive lead frame sheet of FIG. 1, in accordance with an embodiment of the present invention.

Referring to FIG. 3, there is illustrated a top plan view of partially assembled devices 300, formed on the electrically conductive lead frame sheet 100, in accordance with a preferred embodiment of the present invention. Each of the partially assembled devices 300 includes a non-electrically conductive die mounting substrate 301 having a die mounting side 302 with bonding pads 303.

Each of the devices 300 also has a semiconductor die 304 that has a die support mounting surface 308 attached to the die mounting substrate 301 with a deposit of an epoxy or other form of adhesive, e.g., an adhesive tape. The semiconductor die 304 also has a die connection pad surface 305, opposite the die support mounting surface 308, with associated die connection pads 306. The connection pads 306 are circuit nodes of the semiconductor die 304 and each of the pads 306 can typically be: a power supply input node; a data input or output node; or a signal path input or output node as will be apparent to a person skilled in the art.

Figure 4:
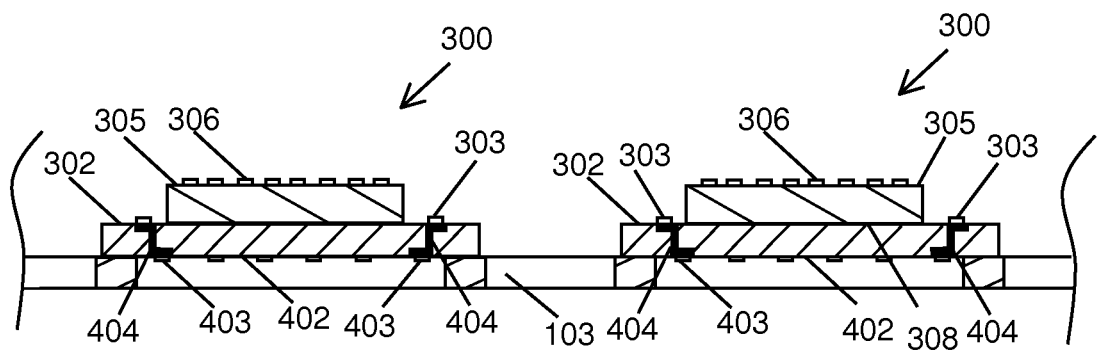
FIG. 4 is a cross-sectional side view of the partially assembled devices of FIG. 3, through 3-3', in accordance with an embodiment of the present invention.

Referring to FIG. 4, there is illustrated a cross-sectional side view of the partially assembled devices 300, through 3-3', in accordance with a preferred embodiment of the present invention. As shown, the die mounting substrate 301 includes the die mounting side 302 and an opposite external connector side 402 mounted on the die support 102 with a deposit of an epoxy or other form of adhesive. The die mounting side 302 includes the bonding pads 303 that are coupled to respective external connection pads 403 on the external connector side 402 of the substrate 301. In this regard, the bonding pads 303 are coupled to their respective external connection pads 403 by conductive vias or in this embodiment by conductive runners 404.

Figure 5:
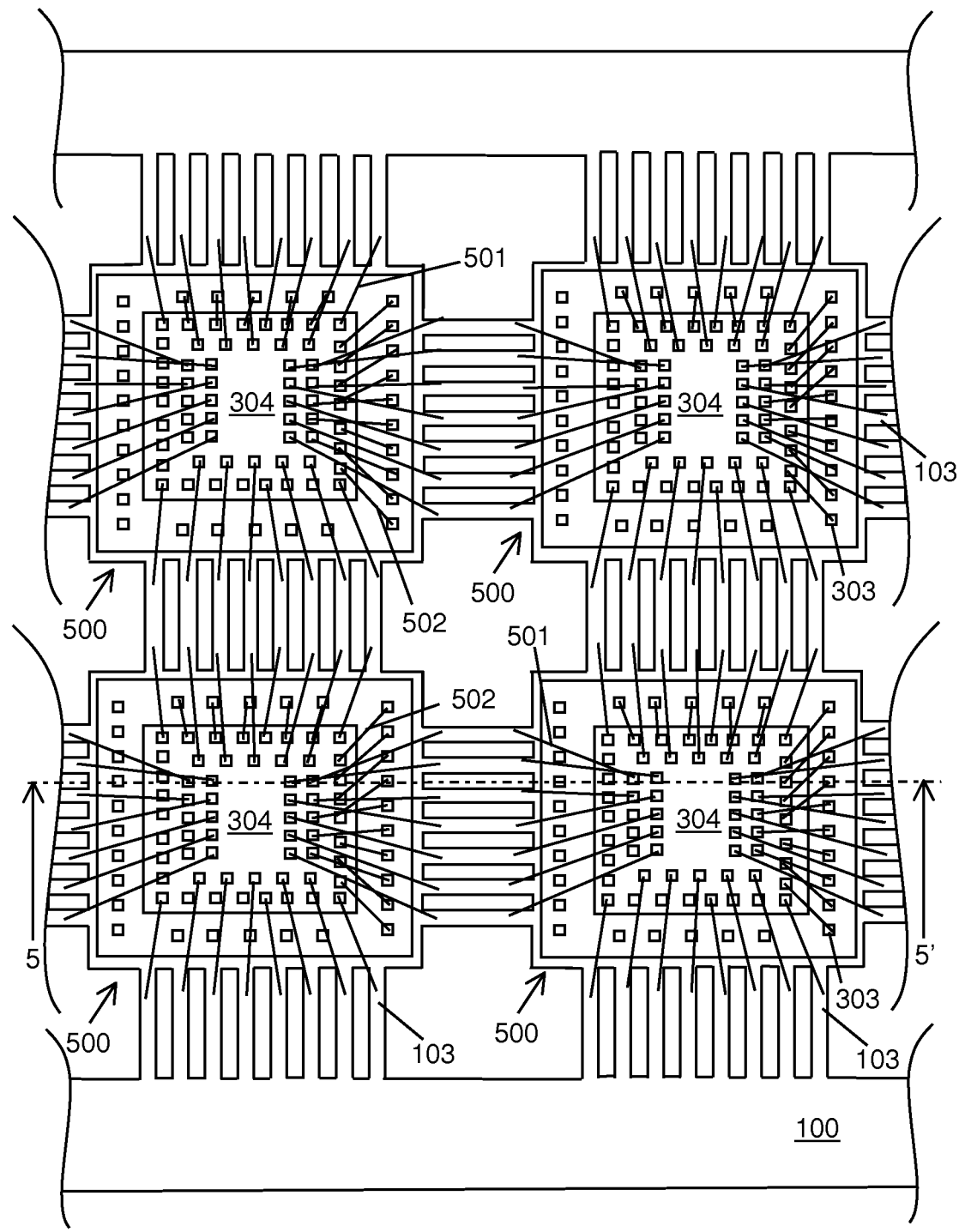
FIG. 5 is a top plan view of wire bonded, partially assembled devices of FIG. 3 in accordance with an embodiment of the present invention.

Referring to FIG. 5, a top plan view of wire bonded partially assembled semiconductor devices 500, comprising the partially assembled devices 300, in accordance with a preferred embodiment of the present invention is illustrated. The wire bonded partially assembled semiconductor devices 500 have bond wires in the form of external lead bond wires 501 and external connection pad bond wires 502. The external lead bond wires 501 provide for selectively electrically coupling the die connection pads 306 to the external leads 103 whereas the external connection pad bond wires 502 provide for selectively electrically coupling the die connection pads 306 to the external connection pads 403 via the bonding pads 303. As will be apparent to a person skilled in the art, for diagrammatic simplicity and clarity not all of the bond wires 501,502 are illustrated. The bond wires 501,502 may be attached using commercially available wire bonding equipment.

Figure 6:
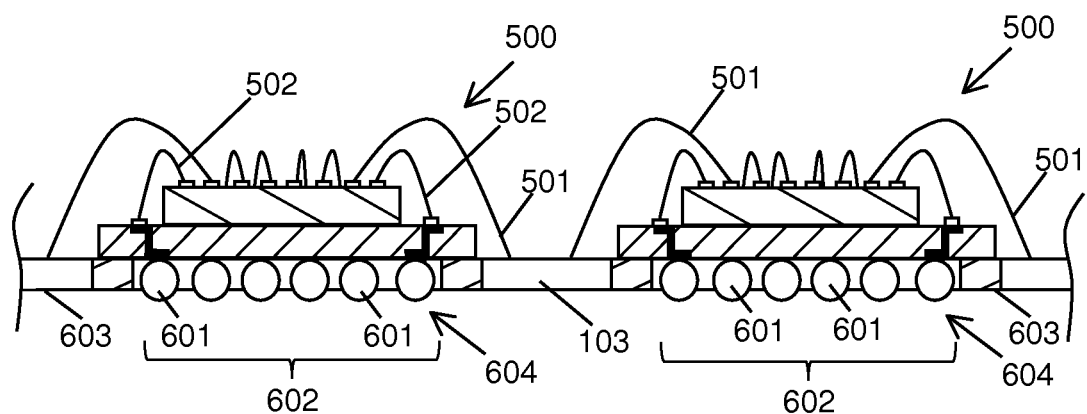
FIG. 6 is a cross-sectional side view of the wire bonded, partially assembled devices of FIG. 5, through 5-5', in accordance with an embodiment of the present invention.

FIG. 6 is a cross-sectional side view of the wire bonded partially assembled semiconductor devices 500, through 5-5', in accordance with a preferred embodiment of the present invention. The wire bonded partially assembled semiconductor devices 500 each have electrically conductive external protrusions 601 mounted to the external connection pads 403. In this embodiment the external protrusions 601 are located at a central region 602 of each of the packages 500 and the spaced parallel members 105 and 106 enclose the central region 602 (the central lead frame space 107). More specifically, the die mounting substrate 301 spans the spaced parallel members 105, 106 and the external protrusions 601 are located at the central region 602 of a surface mounting side 603 of the packages 500. The external protrusions 601 are usually solder balls such as C4 solder balls arranged to form a Ball Grid Array (BGA) 604. However, the external protrusions 601 may take other forms such as pins of a Pin Grid Array (PGA).

Figure 7:
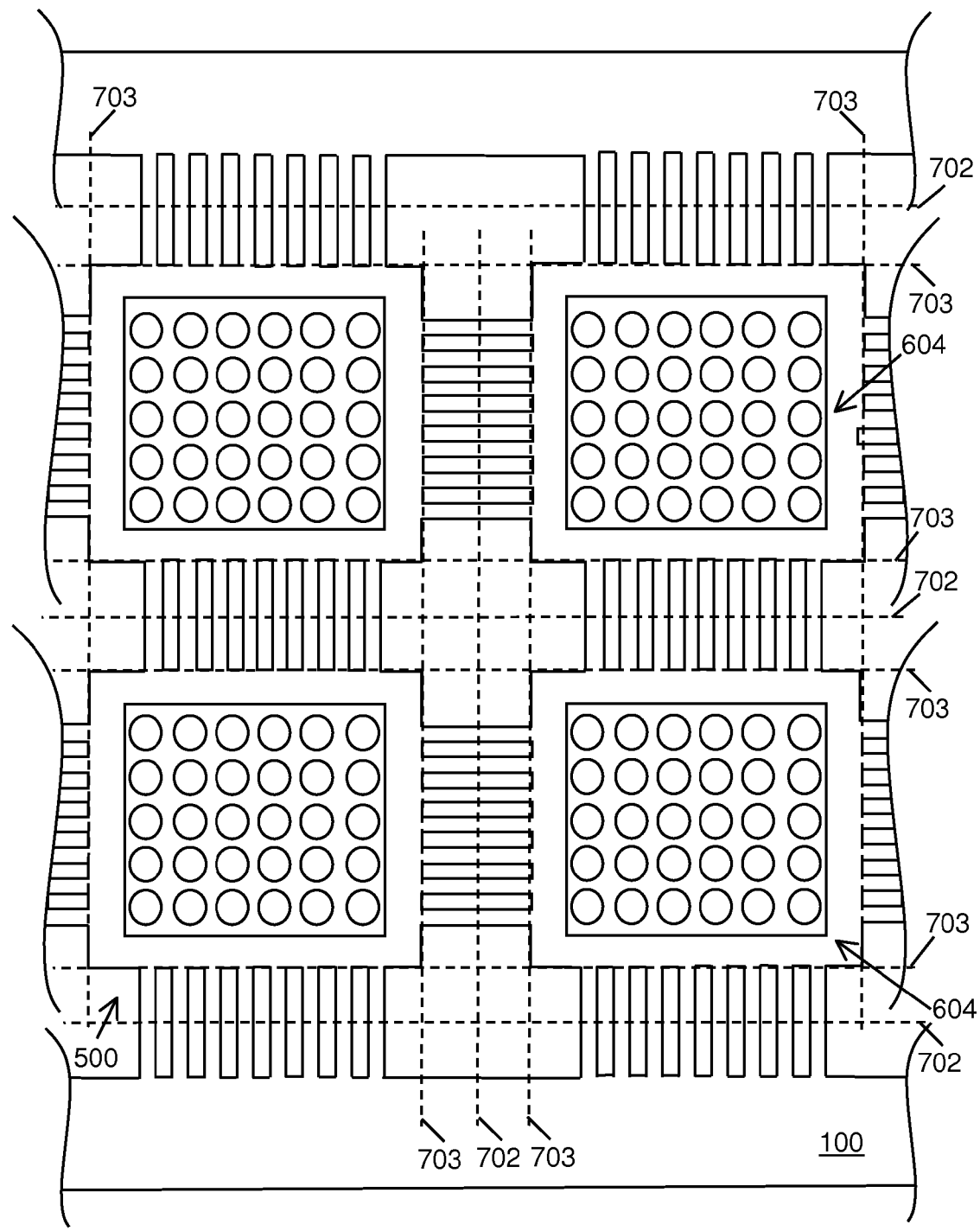
FIG. 7 is an underside plan view of the wire bonded, partially assembled devices of FIG. 5 in accordance with an embodiment of the present invention.

Referring to FIG. 7, there is illustrated an underside plan view of the wire bonded partially assembled devices 500 in accordance with a preferred embodiment of the present invention. As illustrated, the protrusions 601 are uniformly distributed and are located at the central region 602 of the surface mounting side 603 and form the centrally located BGA 604 of solder balls. Also shown are package separation (singulation) planes 702 and die support to lead separation planes 703 which are described in more detail below.

Figure 8:
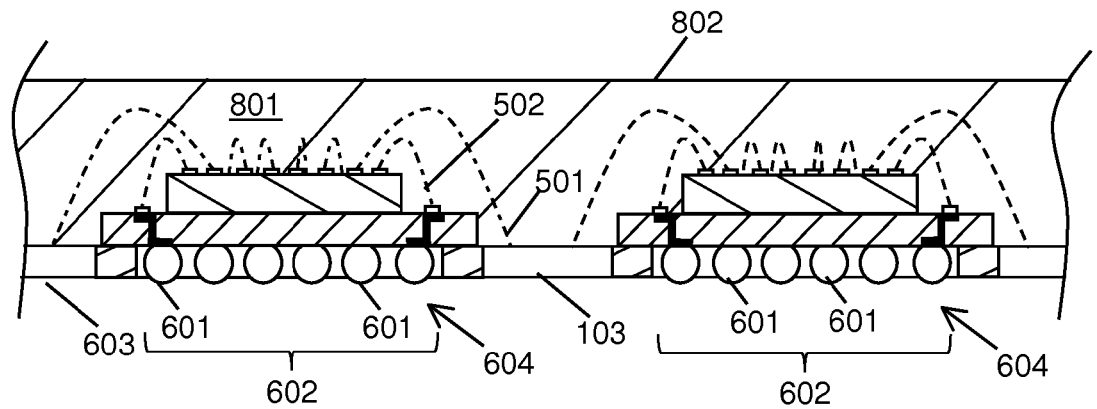
FIG. 8 is a cross-sectional side view of the wire bonded, partially assembled devices of FIG. 5, through 5-5', after encapsulation in accordance with an embodiment of the present invention.

Referring to FIG. 8, a cross-sectional side view of the wire bonded partially assembled device 500, through 5-5', after encapsulation in accordance with a preferred embodiment of the present invention is illustrated. The devices 500 are encapsulated with an encapsulating material 801 that at least partially encapsulates the die 304, the die mounting substrate 301, the bond wires 501, 502 and the leads 103. The encapsulating material 801 is preferably a water resistant electrically insulating compound that is typically a molding compound injection molded in a single continuous block 802 that requires cutting, sawing or otherwise separating (singulated) to form individual packages.

Figure 9:
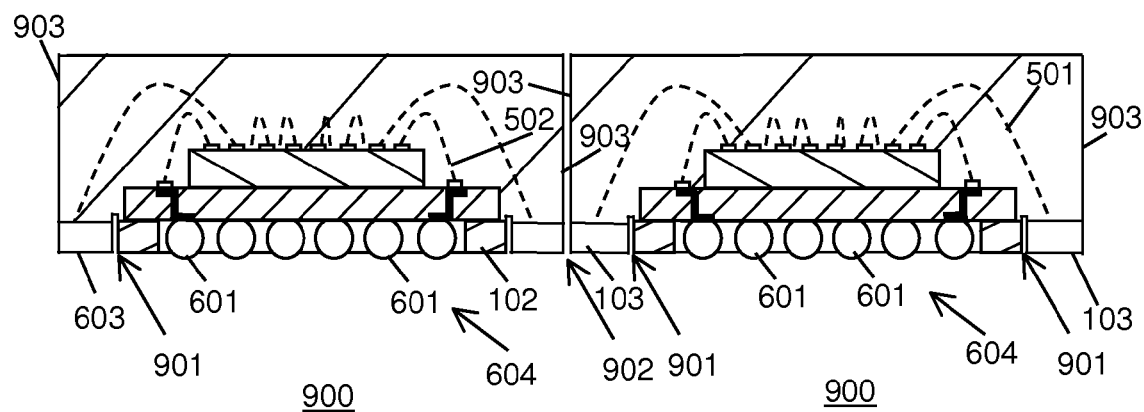
FIG. 9 is a cross-sectional side view of two adjacent singulated semiconductor devices in accordance with an embodiment of the present invention.

Referring to FIG. 9, there is shown a cross-sectional side view of two adjacent singulated semiconductor devices 900 in accordance with a preferred embodiment of the present invention. The devices 900 have been separated (singulated) by a sawing or cutting process along the package separation planes 702 thereby partitioning the external leads 103 and forming partition slots 902 in the continuous block 801 of encapsulating material 801. These partition slots 902 have surfaces defining peripheral edges 903 of each device 900. Also, each of the singulated devices 900 has had channels 901 cut into the external leads 103 to electrically isolate the leads 103 from their respective die supports 102. The channels 901 are cut to such a depth so that they slightly cut into the encapsulating material 801. However, the channels 901 could be etched into the leads 103 thereby eliminating the channels 901 in the encapsulating material 801.

Figure 10:
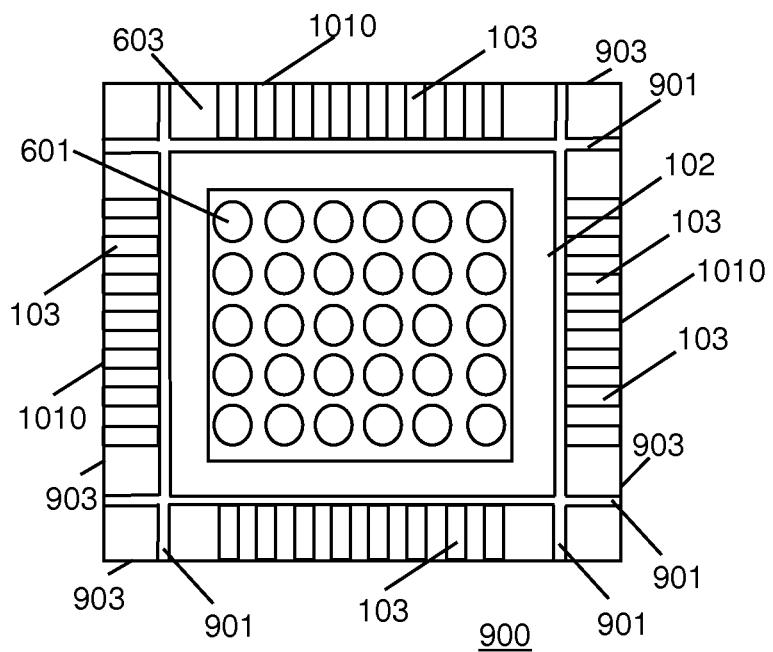
FIG. 10 is an underside plan view of one of the singulated semiconductor devices of FIG. 9 in accordance with an embodiment of the present invention.

Referring to FIG. 10, an underside plan view of one of the singulated devices 900 in accordance with a preferred embodiment of the present invention is illustrated. As clearly shown, the external protrusions in the form of solder balls 601 are located at the central region 602 of the surface mounting side 603 of the package 900. Also, the external leads project outwardly on the surface mounting side 603 from locations (the channels 901) proximal to the die support 102 towards the peripheral edges 903 of the device 900. The channels 901 are in the surface mounting side 603 of the encapsulating material 801 between the die support 102 and leads 103, each of these channels 901 are parallel to one of the peripheral edges 903.

Each of the external leads 103 has a peripheral end 1010 flush with a one of the peripheral edges 903. Furthermore, each peripheral edge 903 is flush with a peripheral end of one or more leads 103. In other words the singulated devices 900 have leads resembling Quad Flat Package (QFP) leads.

Figure 11:
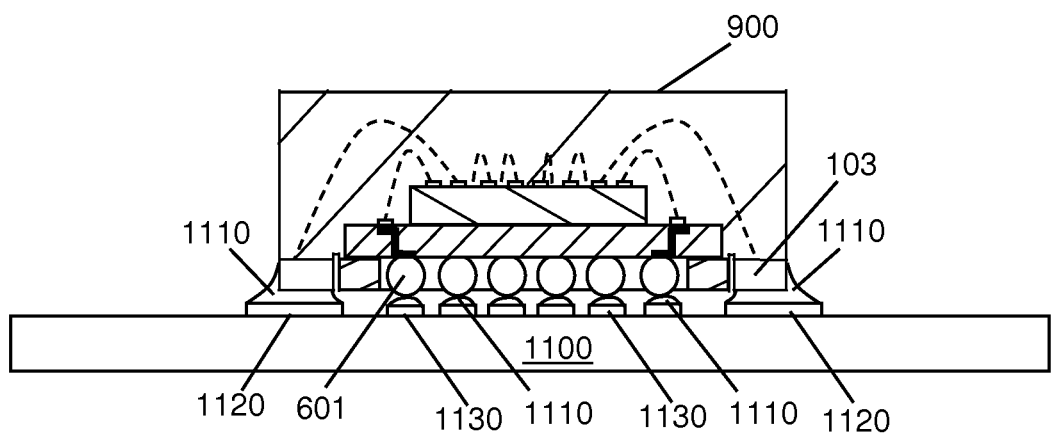
FIG. 11 is a cross-sectional side view of one of the semiconductor devices of FIG. 10 mounted on a circuit board in accordance with an embodiment of the present invention.

In FIG. 11, a cross-sectional side view of one of the semiconductor devices 900 mounted to a circuit board 1100 in accordance with a preferred embodiment of the present invention is shown. The device 900 is undergoing a solder reflow process (in a reflow oven) in which solder paste 1110 has been applied to pads 1120, 1130 on the circuit board 1100. The pads are either lead pads 1120 or array pads 1130 aligned with respective seated leads 103 or solder balls 601. As shown, the solder paste 1110 on the lead pads 1120 has reflowed whereas the solder paste 1120 has yet to reflow as the array pads 1130 have slightly less direct exposure to heat from the reflow oven than the lead pads 1120. However, this solder paste reflow disparity need not necessarily be the case and solder paste 1110 can be blended so that it reflows at the same time on each of the pads 1120, 1130.

Figure 12:
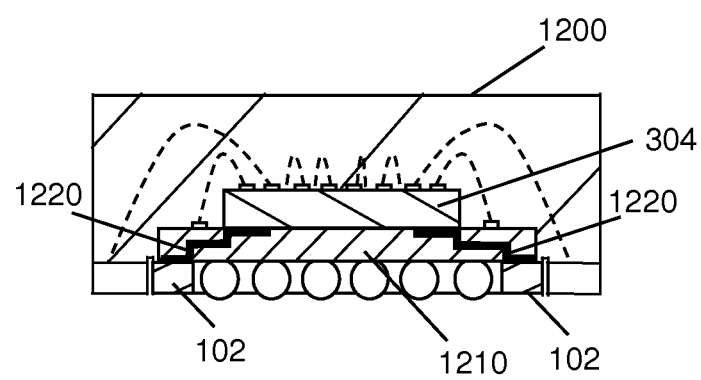
FIG. 12 is a cross-sectional side view of a semiconductor device in accordance with an embodiment of the present invention.

Referring to FIG. 12, a cross-sectional side view of a semiconductor device 1200 in accordance with another preferred embodiment of the present invention is shown. The device 1200 is essentially the same as the device 900 and therefore to avoid repetition only the differences will be described. In this embodiment, the die mounting substrate 1210 has thermally conductive runners 1220 thermally coupling the semiconductor die 304 to the die support 102. Thus, the die support 102 can function as a heat sink which can be soldered to a circuit board heat sink if required. To facilitate the heat sink function of the die support 102, the die support mounting surface 308 is attached to the die mounting substrate 1210 with a deposit of a thermally conductive epoxy or other form of thermally conductive adhesive. Similarly, the semiconductor die 304 is also attached to the die mounting substrate 1210 with a deposit of a thermally conductive epoxy or other form of thermally conductive adhesive.

Figure 13:
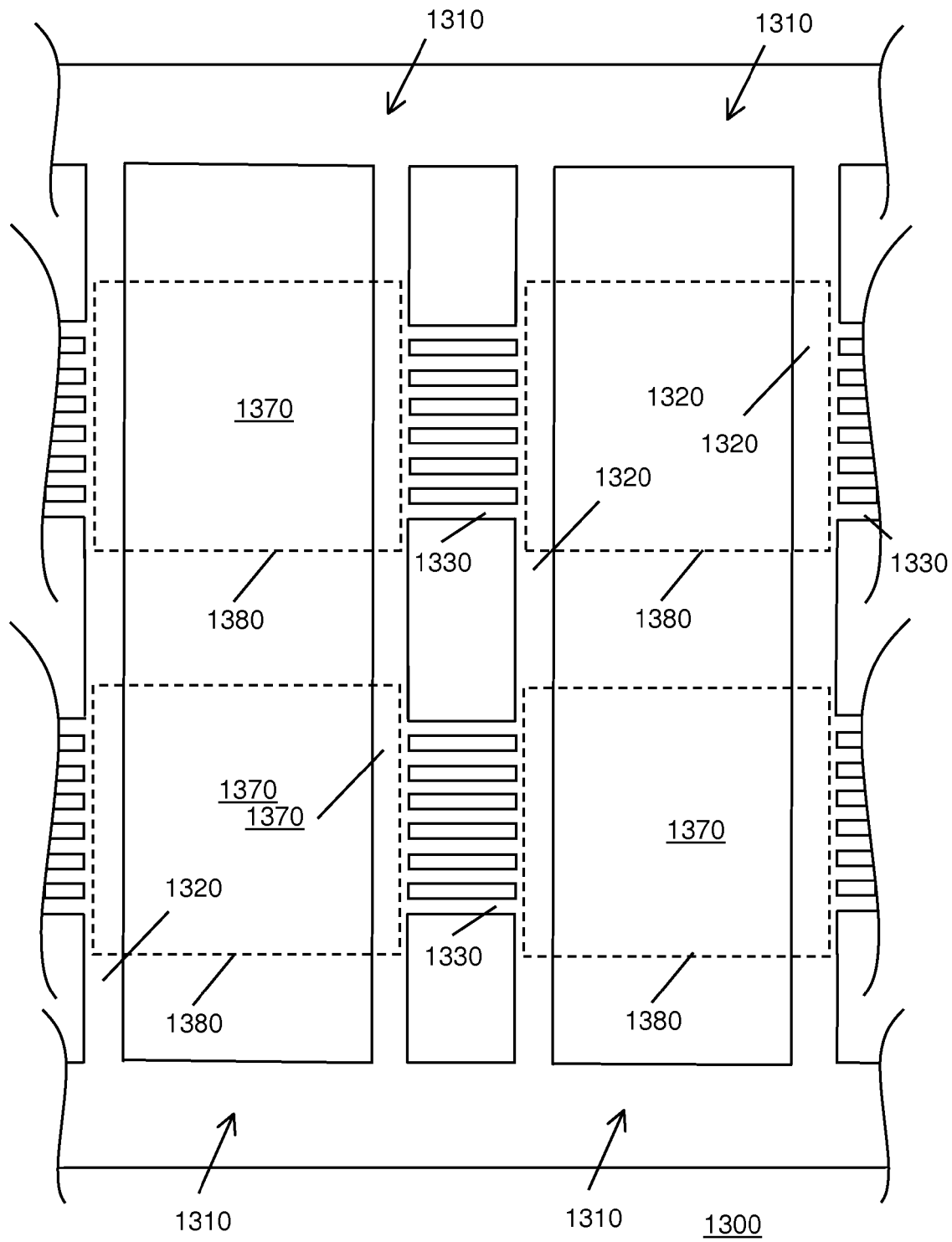
FIG. 13 a top plan view of an electrically conductive lead frame sheet in accordance with an embodiment of the present invention.

Referring to FIG. 13, a top plan view of an electrically conductive lead frame sheet 1300 in accordance with another preferred embodiment of the present invention is shown. The lead frame sheet 1300 has a plurality of lead frames 1310, each comprising a die support 1320 and a plurality of external leads 1330 extending from the die support 1320 to an adjacent die support 1320. The electrically conductive lead frame sheet 1300 and therefore each die support 1320 and external leads 1330 are formed integrally from a single sheet of electrically conductive material such as copper, aluminum or similar metals or alloys thereof. In one embodiment, the sheet 1300 comprises a sheet of copper or copper alloy that is plated with another metal or metals, such as copper plated with a solderable metal that is plated with a Noble metal such as Palladium or Gold, as is known in the art. In this embodiment the die support 102 includes a single set of spaced parallel members 105, 106 partly enclosing a central lead frame space 1370 which is to be spanned by a die mounting substrate in the positions indicated by the phantom rectangles 1380. The electrically conductive lead frame sheet 1300 can be used to form the lead frame packages similar to the embodiments described hereinabove.

Figure 14:
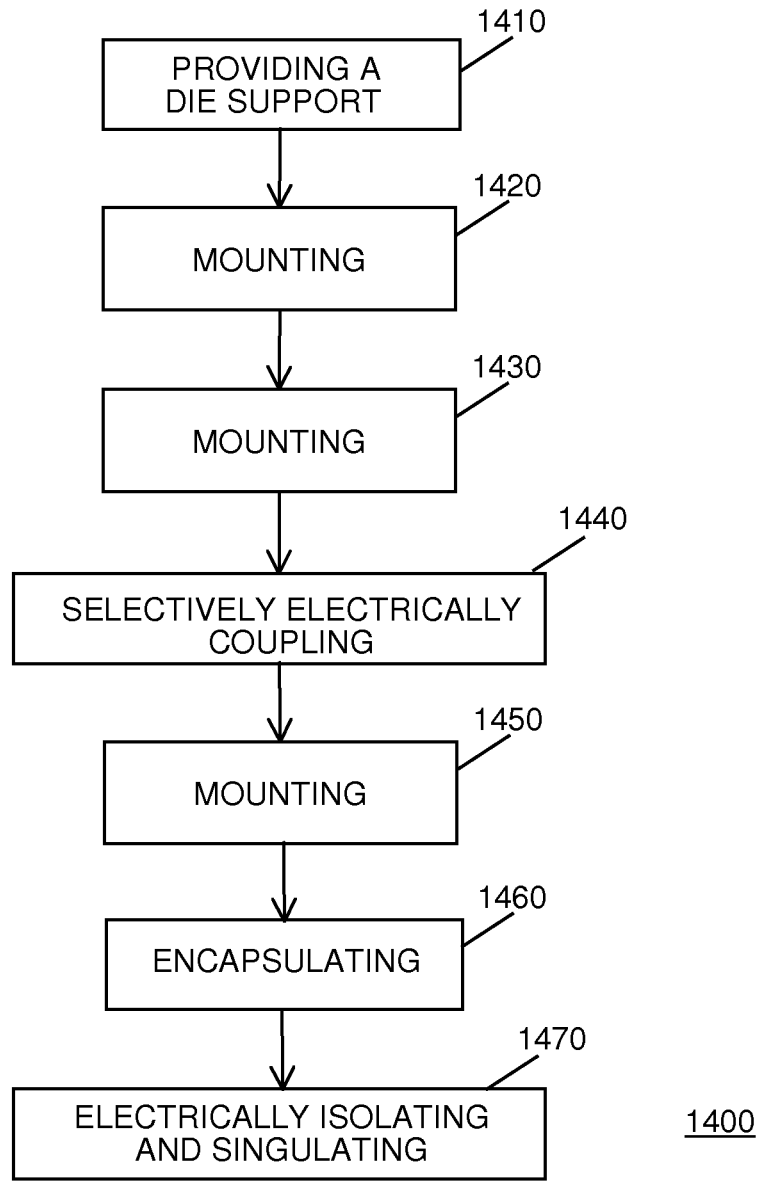
FIG. 14 is a flow chart of a method for assembling a semiconductor device in accordance with an embodiment of the present invention.

Referring to FIG. 14, a flow chart of a method 1400 for assembling a semiconductor device in accordance with a preferred embodiment of the present invention is shown. The method 1400 will be described with reference to the embodiments shown in FIGS. 1-10 and described above. However, the method can be performed using other embodiments such as, for example, the electrically conductive lead frame sheet 1300.

At step 1410, the method 1400 is initiated by providing the die support 102 and external leads 103 formed integrally from the lead frame sheet 100 of electrically conductive material. At step 1420, the die mounting substrate 301 is mounted on the die support 102, and at step 1430, the semiconductor die 304 is attached to the die mounting substrate 301.

At step 1440, the die connection pads 306 are selectively electrically coupled or connected to the external leads 103 and the bonding pads 303, such as by using bond wires and currently available wire bonding equipment. At step 1450, the electrically conductive external protrusions 601 are attached to the external connection pads 403. The protrusions 601 may comprise solder balls such as C4 solder balls and be attached using methods known to those of skill in the art. At step 1460, an encapsulation process is performed, such as transfer molding, to encapsulate or cover at least part of the die 304 with the encapsulating material 801 to form the packaged semiconductor device 900.

At step 1470, a process of electrically isolating the die support 102 from the leads 103 is performed typically by cutting (or sawing), which inevitably leaves the channels 901 in the surface mounting side 603 of the encapsulating material 801. Singulating is also performed by forming partition slots 902 in the continuous block 801 of encapsulating material 801 to provide the individual semiconductor devices 900.

Advantageously, the present invention provides for a combined grid array and external lead surface mounted package. The external leads 103 provide additional rigidity to the package so that the probability of carrier substrate, or package, warping during solder reflow is reduced or at least alleviated. The die support 102 may also assist in reducing or at least alleviating carrier substrate, or package warping, during solder reflow and the die support 102 may also have the added benefit of facilitating a heat sink.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method for assembling a semiconductor device, the method comprising:
    providing a die support and external leads formed integrally from a single sheet of electrically conductive material;
    mounting a die mounting substrate on the die support, the die mounting substrate having a die mounting side and an opposite external connector side mounted on the die support, wherein the die mounting side has bonding pads coupled to respective external connection pads on the external connector side of the substrate;
    mounting a semiconductor die to the die mounting substrate, the semiconductor die having a die support mounting surface attached to the die mounting side of the die mounting substrate, and an opposite die connection pad surface with associated die connection pads, wherein the die connection pads are circuit nodes of the semiconductor die;
    selectively electrically coupling the die connection pads to the external leads and the bonding pads;
    attaching electrically conductive external protrusions to the external connection pads; and
    encapsulating at least part of the die with an encapsulating material to form the semiconductor device,
    wherein the external protrusions are located at a central region of a surface mounting side of the device and the external leads project outwardly on the surface mounting side of the device from locations proximal to the die support towards peripheral edges of the device.

2. The method for assembling a semiconductor device of claim 1, further including electrically isolating the die support from the leads.

3. The method for assembling a semiconductor device of claim 2, wherein the electrically isolating the die support from the leads includes cutting channels therebetween.

4. The method for assembling a semiconductor device of claim 3, wherein the channels are cut into the surface mounting side of the encapsulating material.

5. The method for assembling a semiconductor device of claim 1, wherein the die support includes two spaced parallel members at least partially enclosing the central region.

6. The method for assembling a semiconductor device of claim 5, wherein the die mounting substrate spans the two spaced parallel members.

7. The method for assembling a semiconductor device of claim 1, wherein the external protrusions form a grid array.

8. The method for assembling a semiconductor device of claim 1, wherein each of the external leads has a peripheral end flush with one of the peripheral edges.

* * * * *